US008521455B2

(12) United States Patent
Al-Hamouz et al.

(10) Patent No.: US 8,521,455 B2
(45) Date of Patent: Aug. 27, 2013

(54) SYSTEM AND METHOD FOR ESTIMATING CORONA POWER LOSS IN A DUST-LOADED ELECTROSTATIC PRECIPITATOR

(75) Inventors: Zakariya Al-Hamouz, Dhahran (SA); Amer El-Hamouz, Nablus (PS); Nabil Abuzaid, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 558 days.

(21) Appl. No.: 12/801,544

(22) Filed: Jun. 14, 2010

(65) Prior Publication Data

US 2011/0307198 A1 Dec. 15, 2011

(51) Int. Cl.
*G01R 21/00* (2006.01)
*G06F 11/30* (2006.01)

(52) U.S. Cl.
USPC ................ 702/60; 702/65; 702/182; 702/183

(58) Field of Classification Search
USPC ...................... 702/60–66, 121–123, 182–189
See application file for complete search history.

(56) References Cited

FOREIGN PATENT DOCUMENTS

JP 2006099549 A 4/2006

OTHER PUBLICATIONS

Z.M. Al-Hamouz; Finite Element Analysis of Corona in wire-duct electrostatic precipitation, Industry Applications Conference, 1999. Thirty-Fourth IAS Annual Meeting. Conference Record of the 1999 IEEE, vol. 1, pp. 401-406.*

Z.M. Al-Hamouz; A Combined Algorithm based on Finite Elements and Modified Method of Characteristics for the Analysis of Corona in Wire Duct Electrostatic Precipitators, IEEE, Trams/IA vol. 38, pp. 43-49, 2002.*

Z.M. Al-Hamouz; *Finite element analysis of corona in wire-duct electrostatic precipitators*, Industry Applications Conference, 1999. Thirty-Fourth IAS Annual Meeting. Conference Record of the 1999 IEEE, vol. 1, pp. 401-406.

Z.M. Al-Hamouz; A Combined Algorithm Based on Finite Elements and Modified Method of Characteristics for the Analysis of Corona in Wire-Duct Electrostatic Precipitators, *IEEE*, Trams/ IA vol. 38, pp. 43-49, 2002.

* cited by examiner

*Primary Examiner* — Phuong Huynh
(74) *Attorney, Agent, or Firm* — Richard C. Litman

(57) ABSTRACT

The method for estimating corona power loss in a dust-loaded electrostatic precipitator numerically solves Poisson's equation and current continuity equations in which the finite element method (FEM) and a modified method of characteristics (MMC) are used. The system is a computerized system that produces results showing how different parameters such as discharging wire radius, wire-to-wire spacing, wire-to-plate spacing, fly ash flow speed and applied voltage polarity influence corona power loss and current density profiles.

7 Claims, 14 Drawing Sheets

900

| PARAMETER | VALUE |
|---|---|
| LENGTH OF COLLECTION PLATE (ESP LENGTH IN m) | 2 |
| HEIGHT OF COLLECTION PLATE (ESP LENGTH IN m) | 1 |
| SPACING BETWEEN COLLECTION AND DISCHARGING ELECTRODE (m) | 0.3 AND 0.4 |
| SPACING BETWEEN DISCHARGING ELECTRODES (m) | 0.16 AND 0.21 |
| RADII'S OF DISCHARGING ELECTRODES (mm) | 0.35, 0.5, 0.85 |
| AIR FLOW VELOCITY (m/s) | 0.5–2.2 |
| ATMOSPHERIC PRESSURE (Pa) | 1 |
| ION MOBILITY ($m^2$/V s) | $1.82 \times 10^{-4}$ |
| SUPPLY VOLTAGE (kV) | 0–100 |
| TEMPERATURE OF GAS (k) | 293 |

*Fig. 9A*

SYSTEM AND METHOD FOR ESTIMATING CORONA POWER LOSS IN A DUST-LOADED ELECTROSTATIC PRECIPITATOR

BACKGROUND OF THE INVENTION

1. Field of the Invention

The present invention relates to computer modeling of pollution control devices, and particularly to a computer-implemented method for estimating corona power loss in a dust-loaded electrostatic precipitator.

2. Description of the Related Art

During the 20th century, the world witnessed vast industrial and urban development, which affected positively the standard of life of human beings. However, enormous types of waste in tremendous quantities were generated as a side effect of this development. Particulate emissions are definitely among the industrial waste that needs control. Fly ash is one of the residues generated in the combustion of coal. Fly ash is generally captured from the chimneys of coal-fired power plants, and is one of two types of ash that jointly are known as coal ash. Electrostatic precipitators are one of the most commonly used particulate control devices for collecting fly ash emissions from boilers, incinerators and many other industrial processes.

The basic principles governing the operation of electrostatic precipitators are relatively straightforward, and hence are well described in the literature. The most common geometry for an electrostatic precipitator is the wire-duct or wire-plate electrostatic precipitator (WDEP). A wide range of factors determines the performance of electrostatic precipitators. For optimum design of electrostatic precipitators, it is essential to determine the electric field, current density and hence the coronas power loss and, finally, the collection efficiency.

Theoretical (as well as experimental) analysis in WDEP has received the attention of several investigators. Many of the models reported depend on numerically solving the main system of equations describing the precipitator geometry with a certain choice of boundary conditions. Some models neglect the effect of particle space-charge density and others include it. The charge simulation method has been used to model the electrical characteristics of wire-tube electrostatic precipitators. Such a study involves the evaluation of the electric field, voltage, and charge density distributions in the presence of mild corona quenching. Success has been achieved in the use of the charge simulation method to model the electrical characteristics of cylindrical type electrostatic precipitators in the presence of dust loading. A modified numerical method for calculating the ion and particle charge density, the electric field intensity, and consequently the ion and particle current density in a WDEP has been proposed.

The characteristics of a WDEP have been predicted by combining the method of characteristics and the boundary element method (BEM). In this work, the effect of particle charge density on the precipitator modeling is ignored. Cristina and Feliziani proposed a procedure for the numerical computation of the electric field and current density distributions in a "DC" electrostatic precipitator in the presence of dust, taking into account the particle size distribution. Talaie proposed a model for the prediction of electric field strength distribution and voltage-current characteristics for a high-voltage wire-plate configuration. Ignoring the effect of particle movement and fluid flow, the results of the electrical part of the mathematical model are in good agreement with experimental data.

Zhang et al studied the collisions between charged particles and the collecting plate in a wire-plate electrostatic precipitator (ESP). An experimental study of trace metal emissions from a 220 MW coal fired power plant and a 6 MW fuel oil-based power plant was carried out by Reddy et al. Results of the measurements of the size distribution of seed particles after their precipitation in a wire-plate-type ESP with seven wire electrodes has been investigated by Kocik et al. Nikas et al studied the impact of the ionic wind on the gas flow and its influence on the particle transverse transport velocities in WDEP. The numerical results show the development of cross stream vortices due to ionic wind, with their magnitude depending on the applied wire-to-plate voltage.

Upwind (or downwind) finite difference scheme has been proposed by Lei et al for the calculation of the three-dimensional distributions of the electric potential and the space charge in a wire-plate electrostatic precipitator. Numerical calculations and experimental investigations of gas-particle flows involving an electrical field, as they are found in the electrostatic precipitation process, has been reported by Bottner.

Jedrusik et al. investigated the influence of the physicochemical properties (chemical composition, particle size distribution and resistivity) of the fly ash on the collection efficiency. For this purpose, three electrodes with a difference in design were tested. Under dust-free conditions, simultaneous solution for the governing Poisson's and current continuity equations of WDEP using a combined Boundary Element and Finite Difference Method over a one-quarter section of the precipitator has been reported by Rajanikanth. Xiangrong et al. presented the zero flux boundary condition for the turbulent mixing diffusion model at the wire plane of a wire-plate electrostatic precipitator.

Anagnostopoulos presented a numerical simulation methodology for the calculation of the electric field in wire-duct precipitation systems using finite differencing in orthogonal curvilinear coordinates to solve the potential equation. Neimarlija et al. used the finite volume discretization of the solution domain as a numerical method for calculating the coupled electric and space-charge density fields in WDEP. An unstructured cell-centered second order finite volume method has been proposed for the computation of the electrical conditions by Long et al.

In an experimental study, Miller et al. investigated the impact of different electrode configurations on the precipitator efficiency. Zhuang et al. presented experimental and theoretical studies for the performance of a cylindrical precipitator for the collection of ultra fine particles (0.05-0.5 μm). For particles of the size (0.01-0.1 μm), Ohyama et al. proposed a numerical model for calculation of the WDEP efficiency. For a cylinder wire plate electrode configuration, Dumitran et al. estimated the electric field strength and ionic space charge density.

Talaie et al. proposed a computational procedure to evaluate the voltage current characteristics in WDEP under positive and negative applied voltages. The model took the effect of particle charge into consideration and makes it possible to evaluate the rate of corona sheath radius augmentation as a result of increasing the applied voltage. Measurements of the mass collection rates along a pilot WDEP in an industrial environment has been made by Bacchiega et al. Long et al. used the unstructured finite volume method to compute the three-dimensional distributions of electric field and space charge density. Kim and Lee designed and tested a laboratory scale WDEP. Comparison with existing theoretical models has been made. The study investigated the effect of turbulent flow and the magnitude of rapping acceleration on the collection efficiency.

In computing the ionic space charge and electric field of WDEP, Beux et al. proposed a semi-analytical procedure, based on the Karhunen-Loeve (KL) decomposition to parameterize the current density field. The impact of fly ash resistivity and carbon content on the performance of WDEP has been investigated by Barranco et al.

Thus, in spite of the foregoing analyses, a system and method for estimating corona power loss in a dust-loaded electrostatic precipitator solving the aforementioned problems is desired.

SUMMARY OF THE INVENTION

The system and method for estimating corona power loss in a dust-loaded electrostatic precipitator comprises measuring the electrical properties of a single-stage wire-duct electrostatic precipitator (WDEP), which are influenced by different geometrical and operating parameters. The method numerically solves Poisson's equation and current continuity equations in which the finite element method (FEM) and a modified method of characteristics (MMC) were used. Characteristic lines follow an FE grid pattern, thereby resulting in fast convergence and reduced computational time. A prototype WDEP verified effectiveness of the method. The experiments were carried out under laboratory conditions, and a smoke of fired coal was used as a source of seed particles of PM10 category (around 78% of particles lying below 10 μm). The results show how different parameters, such as discharging wire radius, wire-to-wire spacing, wire-to-plate spacing, fly ash flow speed, and applied voltage polarity influence corona power loss and current density profiles.

These and other features of the present invention will become readily apparent upon further review of the following specification and drawings.

BRIEF DESCRIPTION OF THE DRAWINGS

FIG. 9A is a tabular graph showing geometry and operating parameters.

Similar reference characters denote corresponding features consistently throughout the attached drawings.

DETAILED DESCRIPTION OF THE PREFERRED EMBODIMENTS

The present invention comprises a system and computer-implemented method of estimating corona power loss in a dust-loaded electrostatic precipitator. For validation purposes, the method is compared against empirical measuring of single-stage wire-duct electrostatic precipitator (WDEP) electrical properties, which are influenced by different geometrical and operating parameters. The computer-implemented method numerically solves Poisson's equation and current continuity equations in which information is exchanged between results of a finite element method (FEM) 202 and results of a modified method of characteristics (MMC) 204, each of the methods utilizing results from the other method to converge upon a solution applicable to the single-stage WDEP 100.

Characteristic lines follow an FE grid pattern, thereby resulting in fast convergence and reduced computational time. A prototype WDEP 100 was used to verify effectiveness of the method, which combines the FEM solution block 202 and the MMC solution block 204. The experiments were carried out under laboratory conditions, and a smoke of fired coal was used as a source of seed particles of PM1O category (around 78% of particles lying below 10 pm). The results show how different parameters, such as discharging wire radius, wire-to-wire spacing, wire-to-plate spacing, fly ash flow speed, and applied voltage polarity influence corona power loss and current density profiles.

Figure 1:
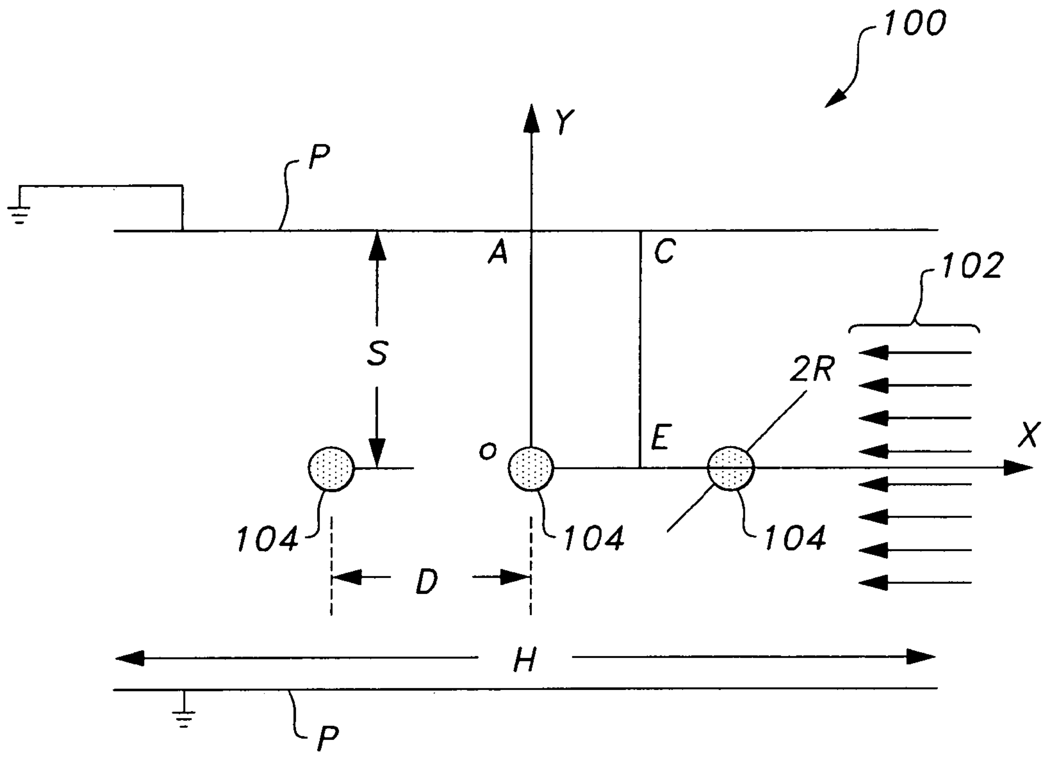
FIG. 1 is a diagrammatic view of a wire-duct electrostatic precipitator.

FIG. 1 shows a diagrammatic view of a wire-duct electrostatic precipitator 100. When the applied voltage is raised, the gas 102 near the more sharply curved wire electrodes 104 breaks down at a voltage above what is called the onset value and less than the spark breakdown value. This incomplete dielectric breakdown, which is called a monopolar corona, appears in air as a highly active region of glow. The monopolar corona within duct-type precipitators includes only positive or negative ions (the back corona is neglected), the polarity of the ions being the same as the polarity of the high voltage wires in the corona. As shown in FIG. 1, R is the wire (electrode) radius and 2R is its diameter, S is the spacing between the wire 104 and the plate P, D is the spacing between adjacent wires 104, and H is the length of the precipitator 100. The following system of equations describes the monopolar corona for the aforementioned configuration corona of WDEP 100:

$$\nabla\cdot\vec{E}=\rho/\epsilon_0 \quad (1)$$

$$\nabla\cdot\vec{J}=0 \quad (2)$$

$$\vec{E}=-\nabla\phi \quad (3)$$

$$\vec{J}=\vec{J}_{io}+\vec{J}_p \quad (4)$$

$$\vec{J}_{io}=k_{io}\rho_{io}\vec{E} \quad (5)$$

$$\vec{J}_p=k_p\rho_p\vec{E} \quad (6)$$

where $\vec{E}$ is the electric field intensity vector, ρ is the total space charge density (summation of the ion charge density $\rho_{io}$ and particle charge density $\rho_p$, i.e., $\rho=\rho_{io}+\rho_p$), $\vec{J}$ is the total current density vector, $\phi$ is the potential, $\epsilon_0$ is the permitivity of free space, and $k_{io}$ and $k_p$, are the mobilities for ions and particles, respectively.

Relation (1) represents Poisson's equation, relation (2) represents the current continuity equation, relation (3) represents the field equation, and relation (4) represents the total current density equation. The total current density is determined by the ion current density relation (5) and the particle current density relation (6). The exact analytical solution to these equations can only be obtained for parallel plates, coaxial cylinders and concentric spheres. Because of the nature of this problem, a numerical solution is anticipated as a tool for solving this set of equations. The following assumptions and boundary conditions are essential requirements for finding a numerical solution.

The influence of particle space charge density on the field may be approximated by assuming that the particle concentration is constant over a given cross section of the precipitator. The particle's specific surface $S_p$, (the surface per unit volume of gas) is given as:

$$S_p=4\Pi a^2 N_p \tag{7}$$

where a is the radius of assumed spherical particles and $N_p$ is the particle concentration.

The corona discharge is assumed to be distributed uniformly over the surface of the wires; if the corona electrode has a potential above a certain value, called the onset level, the normal component of the electric field remains constant at the onset value $E_0$, which results from Peek's derivation, and later known as Kaptzov's assumption. Moreover, the ion mobility is assumed constant. Additionally, ion diffusion is ignored.

The boundary conditions include the potential at the two plates being zero, the potential at the discharging wires being V, the electric field at the discharging wires being $E_0$ which is given by:

$$E_0 = 3.1\times 10^6\left(1+\frac{0.308}{\sqrt{0.5\times R}}\right) \tag{8}$$

Figure 2:
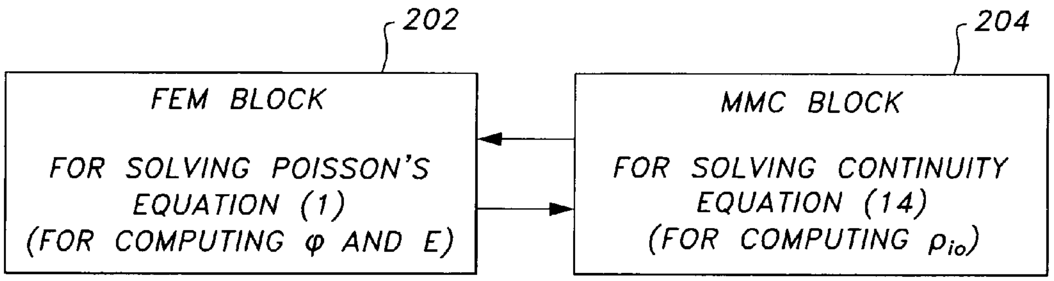
FIG. 2 is a block diagram showing FEM and MMC coupling.

The numerical procedure includes a plurality of steps. Equations (1) through (6), which describe the WDEP 100, are coupled partial differential equations (PDEs). Therefore, the continuity equation can be solved if the electric field (or potential) is known. Poisson's equation can be solved if the ionic space and/or particle charge density values are assumed known. Due to the double symmetry in the precipitator geometry, as most clearly shown in FIG. 1, it is sufficient to study only the area defined by segments AOEC for any number of corona wires, provided symmetry is preserved. As a result of the double symmetry, the boundary conditions $E_x$=0 along the symmetry line O-A (where 0 is at the center of the corona wire) and $E_y$=0 along the symmetry line O-E (which is parallel to the grounded plates P) are indirectly satisfied. Therefore, as shown in FIG. 2, the solution algorithm includes coupling between FEM block 202 and MMC block 204. The FEM block 202 is used for solving Poisson's equation (1) to compute $\phi$ and E, while the MMC block is used for solving the continuity equation to compute the ionic space charge density $\rho_{io}$.

Figure 3:
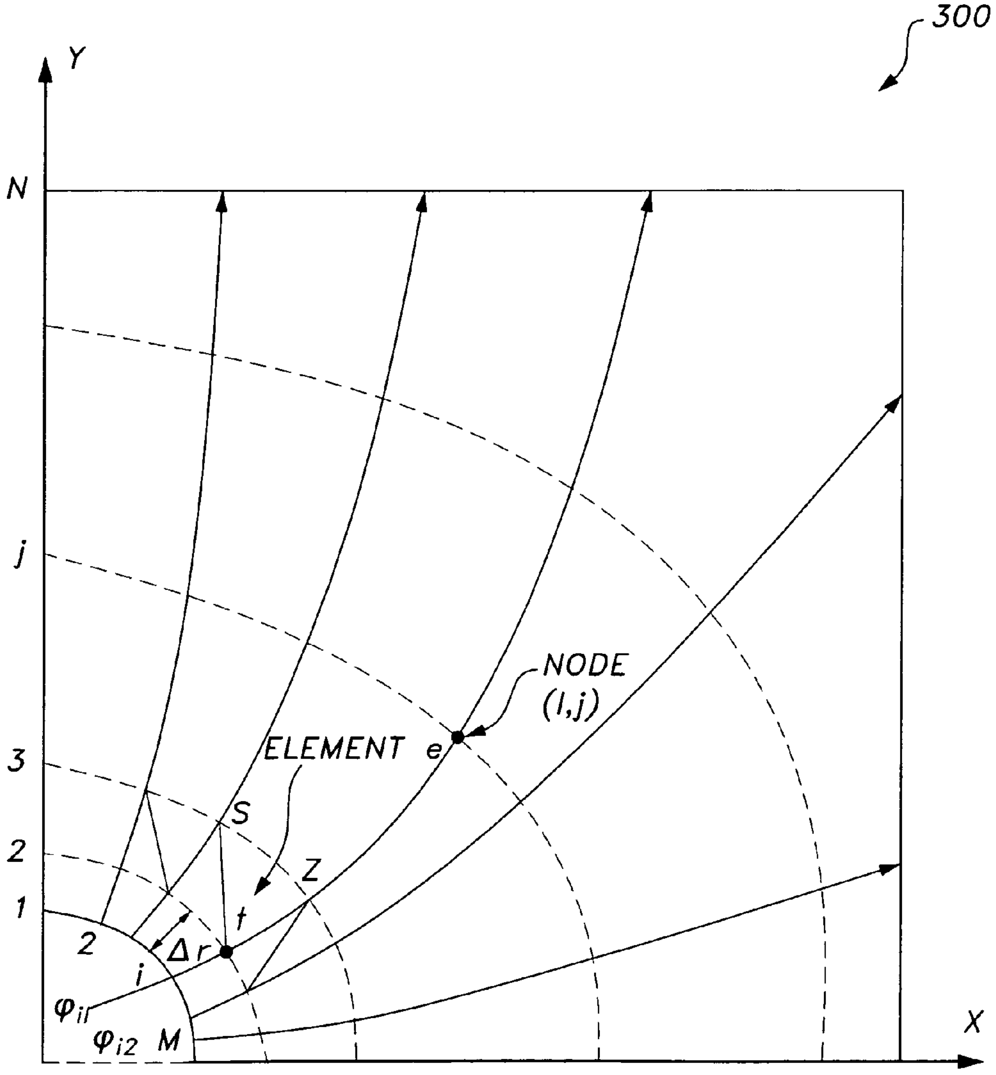
FIG. 3 is an equipotential grid plot showing the formation of triangular elements.
Figure 4:
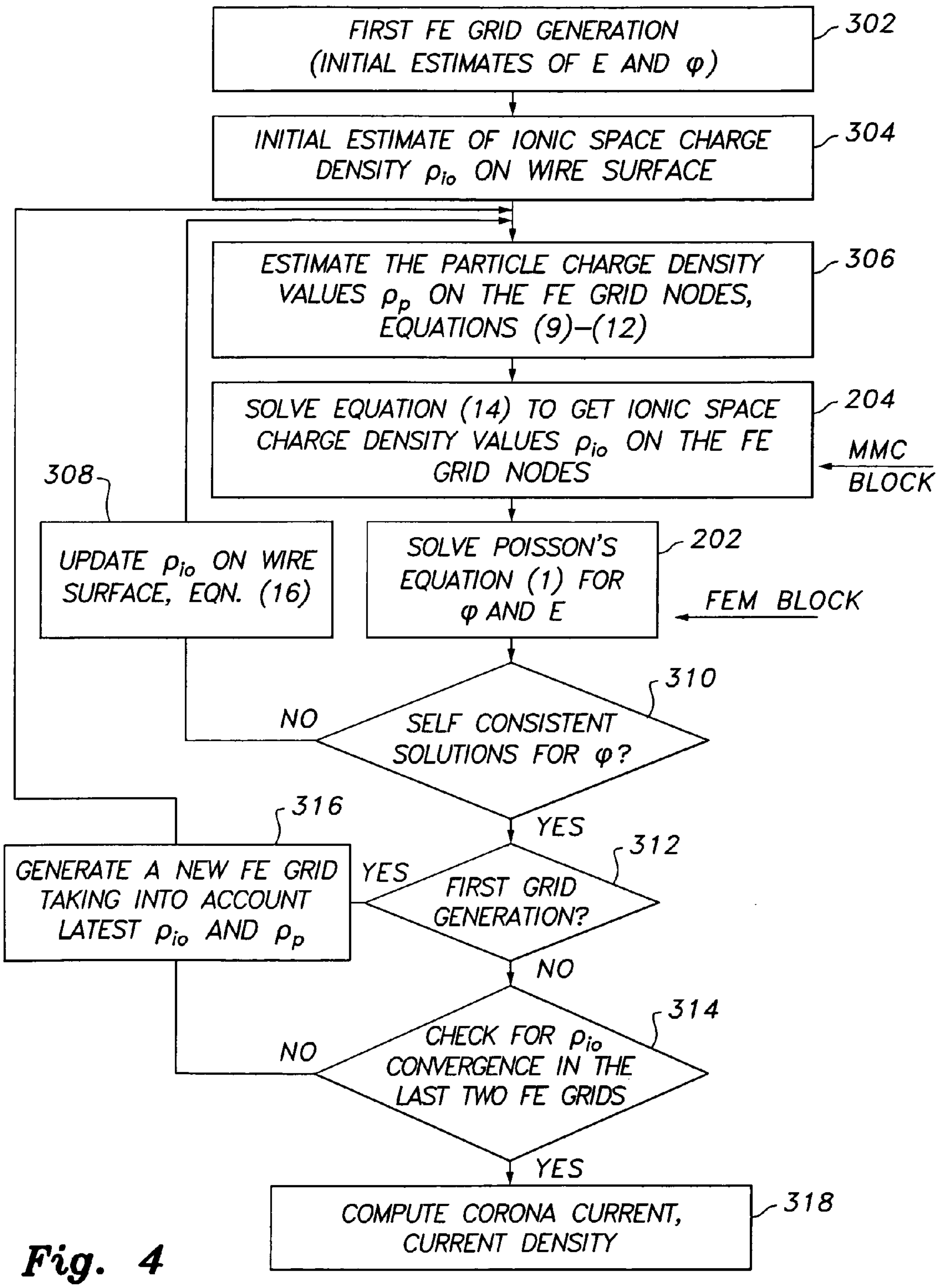
FIG. 4 is a flowchart of steps in a method for estimating corona power loss in a dust-loaded electrostatic precipitator according to the present invention.

In a first FE grid generation step at block 302 (as shown in FIG. 4), an FE boundary fitted grid 300 (as shown in FIG. 3) matched to the geometry of WDEP 100 is generated. The grid 300 is generated from the intersection of field lines, which emanates from M nodes selected on the circumference of the discharging conductor 104, and N equipotential counters. The grid 300 is made fine in the regions of high field gradient and becomes coarse in regions of low field gradients. After generating the free space charge FE grid, the electric field values at the FE nodes are determined from a third order interpolating polynomial of the potentials. Dividing each quadrilateral formed from the intersection of field lines with equipotential contours into two triangles generates the triangular finite elements exemplified by ELEMENT e.

In a second step at block 306, using the estimated electric field values on the FE grid nodes, the particle charge density at each node is calculated from equation (9)

$$\rho_p=\epsilon_0 f S_p E \tag{9}$$

where f=3 for conducting particles and f=3$\epsilon$/$\epsilon$+2 for particles of relative permittivity $\epsilon$, as most clearly demonstrated by the following equations;

$$\rho_p=\xi E \tag{10}$$

$$\xi=4\Pi\epsilon_0 f a^2 N_p \tag{11}$$

The particle mobility can be calculated as:

$$k_p=\rho_p/6\Pi N_p \gamma a \tag{12}$$

where $\gamma$ is the air viscosity.

The first estimate of the ionic space charge density values at the FE grid nodes at block 304 can be made by satisfying the current continuity equation (2) using the MMC. The method of characteristics (MMC) is based on a technique whereby the partial differential equation governing the evolution of charge density becomes an ordinary differential equation along specific "characteristic" space-time trajectories. The present corona power loss estimation method provides a modified method of characteristics (MMC) where the partial differential equation (PDE) governing the evolution of charge density becomes an ordinary differential equation (ODE) along specific "flux tube" trajectories. The present method introduces special flux tubes for the purpose of transforming the PDE into an ODE. The special flux tubes start at the surface of the discharging wire and terminate at the grounded plates. The ionic space charges are assumed to flow along the centers of these flux tubes, i.e., the field lines shown in FIG. 3. Therefore, the present method eliminates the problem that the characteristic lines never follow the FE grid pattern. As such, equation (2) can be written as:

$$\nabla\cdot\vec{J}=\nabla(k_{io}\rho_{io}E+k_p\rho_p E)=0 \tag{13}$$

To simplify satisfying the continuity condition, particle charge density values $J_p=k_p\rho_p{}^E$ are assumed constant in each iteration. Therefore, equation (13) has been simplified to solve for the ionic space charge density values at the FE grid nodes. As a result, equation (13) can be written along each flux tube as:

$$\frac{d\rho_{io}}{dl}\hat{l} = -(\rho_{io}^2+\rho_{io}\rho_p)/\varepsilon_0 E \tag{14}$$

where $\hat{l}$ is a unit vector along the axis of the flux tube, that is, along the direction of E. The initial estimate of the ionic space charge density values on the circumference of the discharging electrode is assumed to be known by those having ordinary skill in the art.

A third step at block 204 provides ionic space charge density values $\rho_{io}$ on the finite element grid nodes by solving equation (14) using the modified method of characteristics. For known values of the ionic space charge and particle charge densities at the FE nodes, Poisson's equation (1) is solved in the area AOEC by means of the FEM block 202. The potential within each finite element is approximated as linear function of coordinates, $$\phi=\phi^e W^e=\phi_z w_z+\phi_s w_s+\phi_t w_t \quad (15)$$

with z, s, and t representing the nodes of the element e and W is the corresponding shape function. The constancy of the electric field at the discharging wire at a value of $E_0$ is directly implemented into the FE formulation. This is achieved by noting that $(\phi_{i,1}-\phi_{i,2})/\Delta r_i=E_0$ where $\Delta r_i$ is the radial distance between the first two nodes along the axis of any flux tube. Since $\phi_{i,1}$ is the applied voltage, which is known, then $\phi_{i,2}$, the potential at node (i,2), the $i_{th}$ node along the second equipotential contour, is also known, and hence the boundary condition of constant electric field at the discharging wire is satisfied. It is worth mentioning, however, that $\Delta r_i$ is much smaller than the discharging wire radius. Again, the electric field values at the FE nodes are determined from a third order interpolating polynomial of the potentials. Decision block 310 determines whether the fourth step should be performed. If the solution for $\phi$ is not self-consistent, then the fourth step should be performed.

The fourth step, at block 306 and at MMC block 204, is a particle and space charge density correction, which uses the estimated electric field values at the FE nodes to update the particle charge density at these nodes via computation using equations (9) through (12). On the other hand, correction of the ionic space charge density is made by comparing the computed values of the potential at the kth node in iterations n and n+1. A nodal potential error, $e_r$ relative to the average value of the potential, $\phi_{av}$, at that node is estimated. If the maximum of $e_r$ along the axis of the ith flux tube exceeds a pre-specified value $\delta_1$ a correction of the ionic space charge density values $\rho_{i,1(io)}$ (corresponding to the ith flux tube) is made at block 308 according to the maximum nodal error, as in equations (16a, 16b, and 16c):

$$\rho_{i,1(io)_{new}}=\rho_{i,1io_{old}}[1+g\max(\phi_k^{n+1}-\phi_k^n)/\phi_{av}]i=1,2,\ldots M \quad (16a)$$

$$e_r=|\phi_k^n-\phi_k^{n+1}|/\phi_{av} \quad (16b)$$

where:

$$\phi_{av}=(\phi_k^n+\phi_k^{n+1})/2 \quad (16c)$$

and where g is an accelerating factor taken to be equal to 0.5 and M is the number of flux tubes. The ionic space charge density values at the rest of the FE nodes are estimated again by solving equation (14).

The fifth step, at FEM block 316 and Decision block 310, is an iteration including block 308 to converge to a self-consistent solution wherein Steps 2 through 4 are repeated until the maximum nodal potential error of equation (16b) is less than a pre-specified value, $\delta_1$.

Decision block 312 determines whether there should be a next FE grid generation. In the next FE grid generation step 6, designated as block 316, the finite element grid is regenerated to take into account the latest nodal ionic, $\rho_{io}$ and particle space charge values $\rho_p$ until a self-consistent solution is obtained again for $\phi$.

This process of grid generation and obtaining self-consistent solutions for $\phi$ and $\rho$ continues until, for the last two generations, the maximum difference of the ionic space charge density $\rho_{io}$ at the FE nodes is less than a pre-specified value determined at decision block 314 ($\delta_2$ taken as 0.1% in the present exemplary case).

The seventh step, at block 318, is a computation of corona current and corona power loss taking into account the fact that for the whole discharging wire, the corona current is calculated as:

$$I=4\sum_{i=1}^{M} J_i A_{i,1} \quad (17)$$

where $J_i$ is the per-unit current density at the ith flux tube, and $A_{i,1}$, is the corresponding per unit cross-sectional area. The corona power loss per meter is the multiplication of the applied voltage by the corresponding corona current per meter.

Figure 5:
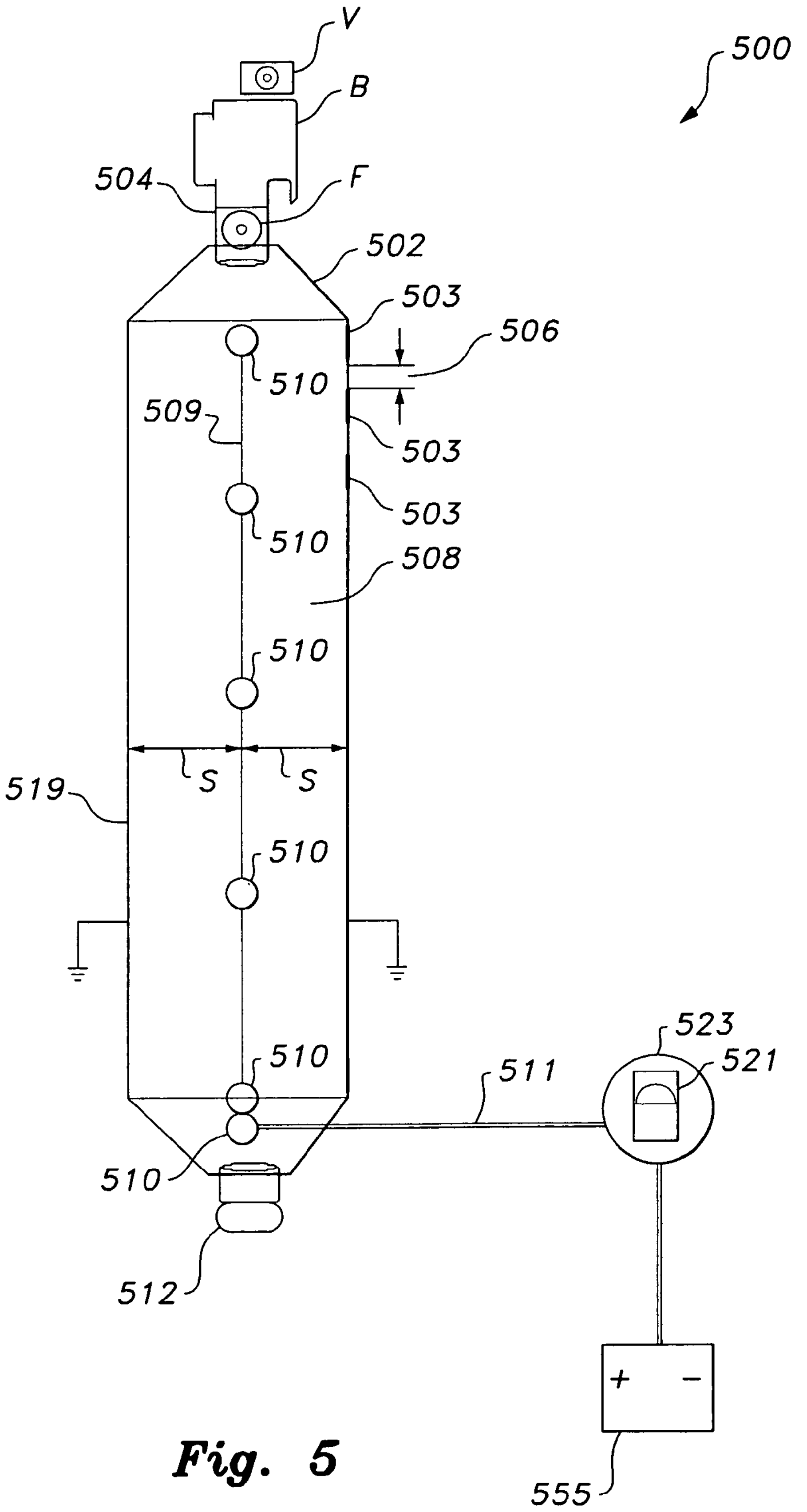
FIG. 5 is a top view of a fabricated experimental configuration.

As shown in FIG. 5, the prototype experimental WDEP configuration comprises a single stage, dry-type, parallel plate electrostatic precipitator 500, which was designed and fabricated at the High Voltage Laboratory, RI, King Fahd University of Petroleum & Minerals.

The setup includes a high voltage source 555 (up to ±100 kV), with a dust particle feeder and blower B. The electrostatic precipitator 500 includes a first (2 m×1 m) plate covered by a plurality of aluminum strips 503 (1 m×5 cm) separated by a 3 mm spacing 506, and an unbroken aluminum sheet-covered second plate 519. This arrangement makes it possible to measure the grounded plate current density profile. In order to measure the current density at each strip, holes were made through each strip, nails were placed through the holes, and wires were connected between the nails and a current measuring board. The experimental setup enables the plate-to-plate spacing 2S=(S+S), and the discharging wire-to-wire spacing D (as illustrated in FIG. 1) to be changed. The voltage source 555 is connected via an equipotential sphere 523 and electrically connected ammeter 521 to a conductor rod 511 hanging horizontally from the rooftop 508. A variable AC transformer V controls the speed of the blower B as particles are discharged through a funnel F surrounded by a pipe 504. The particles are dispersed in a frustoconical flexi glass dome 502 and blown into a chamber defined by the plates and movable flexi glass rooftop 508. Sphere-tipped movable conductors 510 enable wire-to-wire spacing (D as shown in FIG. 1) to be changed in gathering empirical corona discharge power loss measurements. A filter 512 is disposed at an end of the device most distal from the particle dispersing funnel F.

Figure 6:
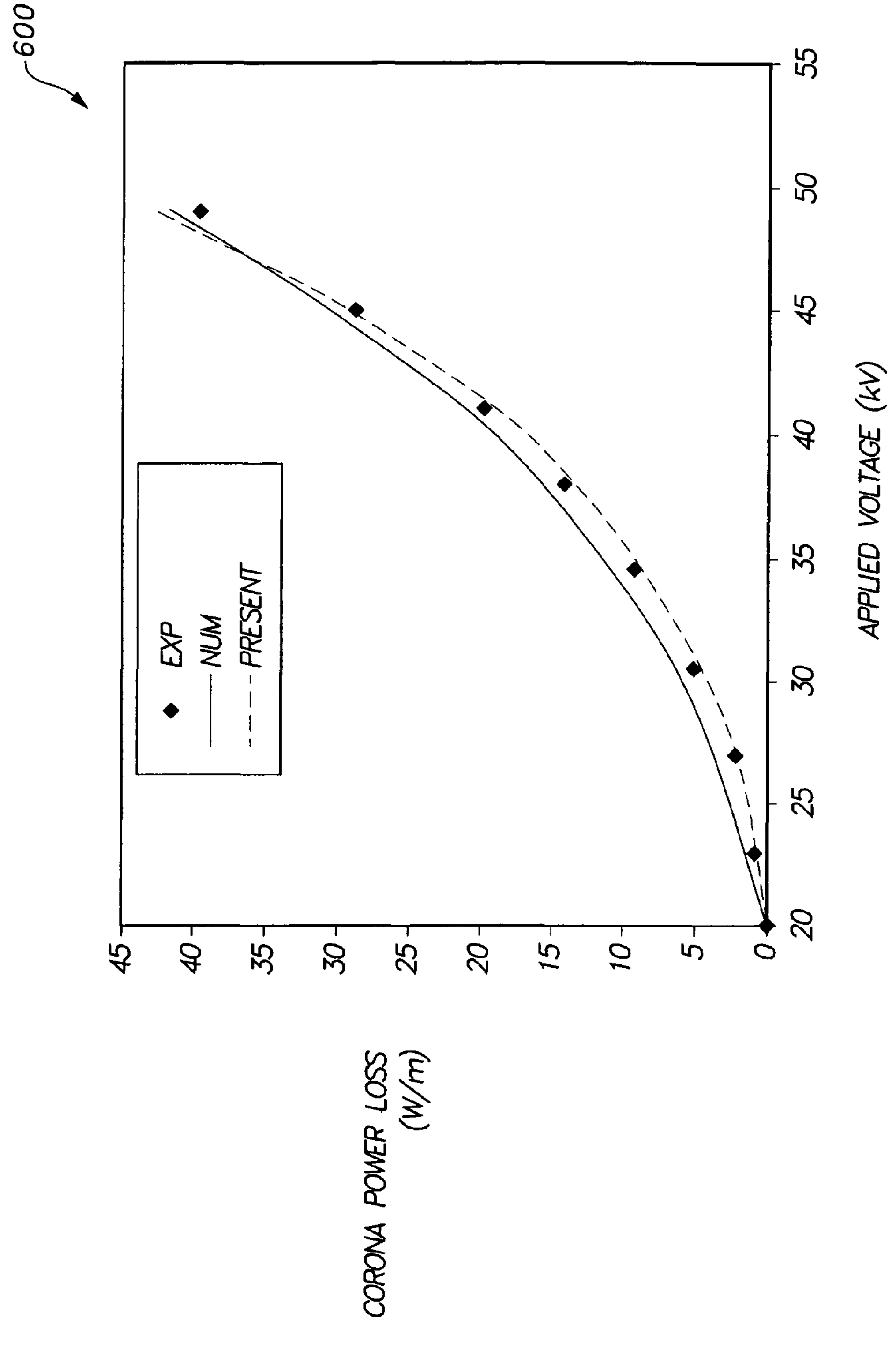
FIG. 6 is a plot showing comparing power loss characteristics.

The numerical and experimental results include a comparison with previous experimental and numerical findings. A standard configuration where cement dust particles have a dominant particle radius of 30 μm was used to test the effectiveness of the computational algorithm. For this WDEP model, the discharging wire radius R is 0.521 mm, wire-to-plate spacing S is 101.6 mm, and wire-to-wire spacing D is 203.2 mm. The method generates 526 finite element nodes and converges in 3 grid generations, each with 7 iterations. The plot 600 of presently calculated corona power loss compared to previously measured and calculated values is shown in FIG. 6. The power loss calculation method touches most of the experimental (empirical) plotted points.

Figure 7:
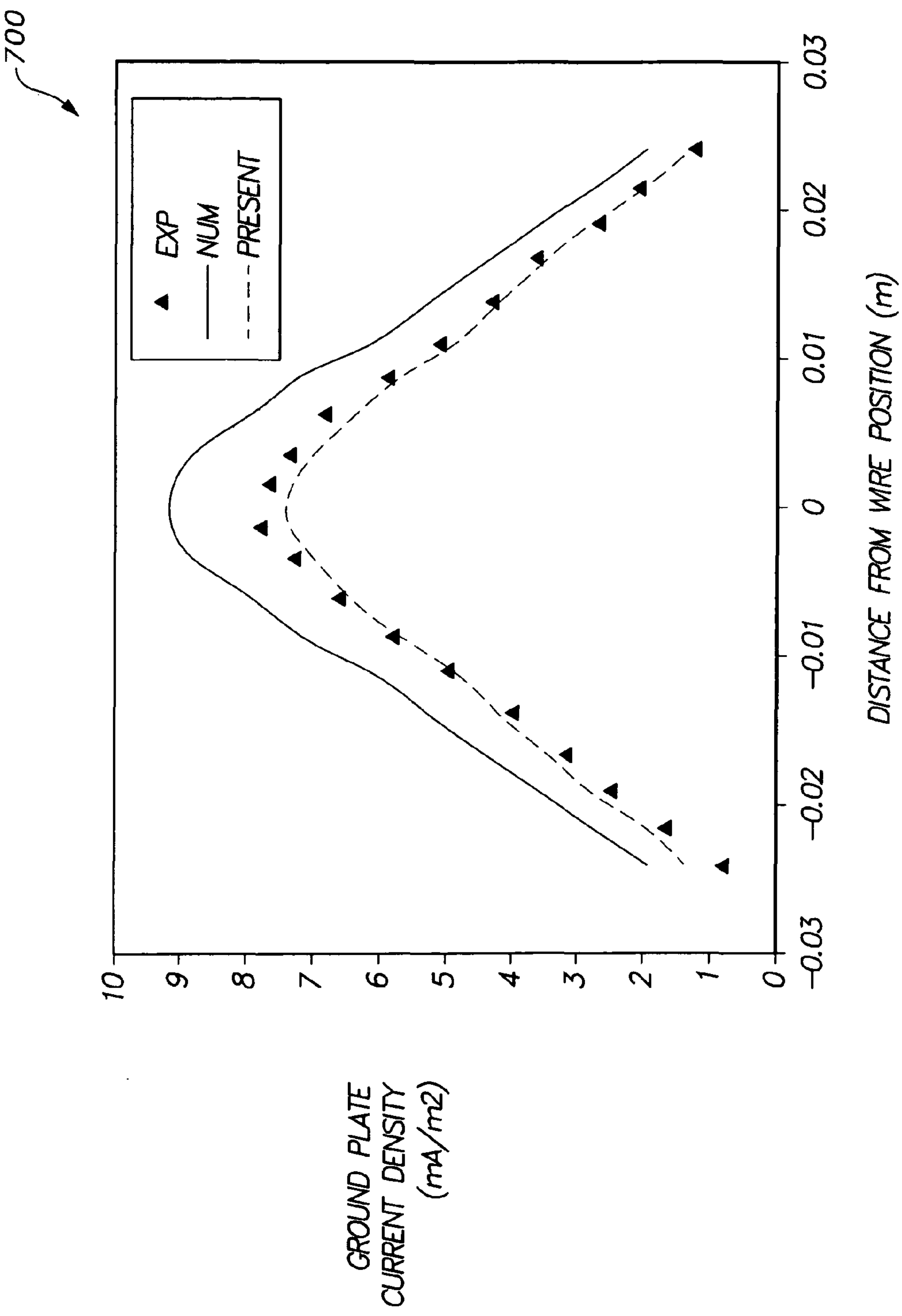
FIG. 7 is a plot showing ground plate current density profile.

For another configuration with a discharging wire radius R of 0.204 mm, wire-to-wire spacing D of 50 mm, wire-to-plate spacing S of 25 mm and a positive applied voltage of 15 KV, the plot 700 of previously calculated and measured collecting plate current density profiles as compared to the presently calculated values is shown in FIG. 7. Again, it is clear that the present computed results substantially agree with experimental values.

Figure 8:
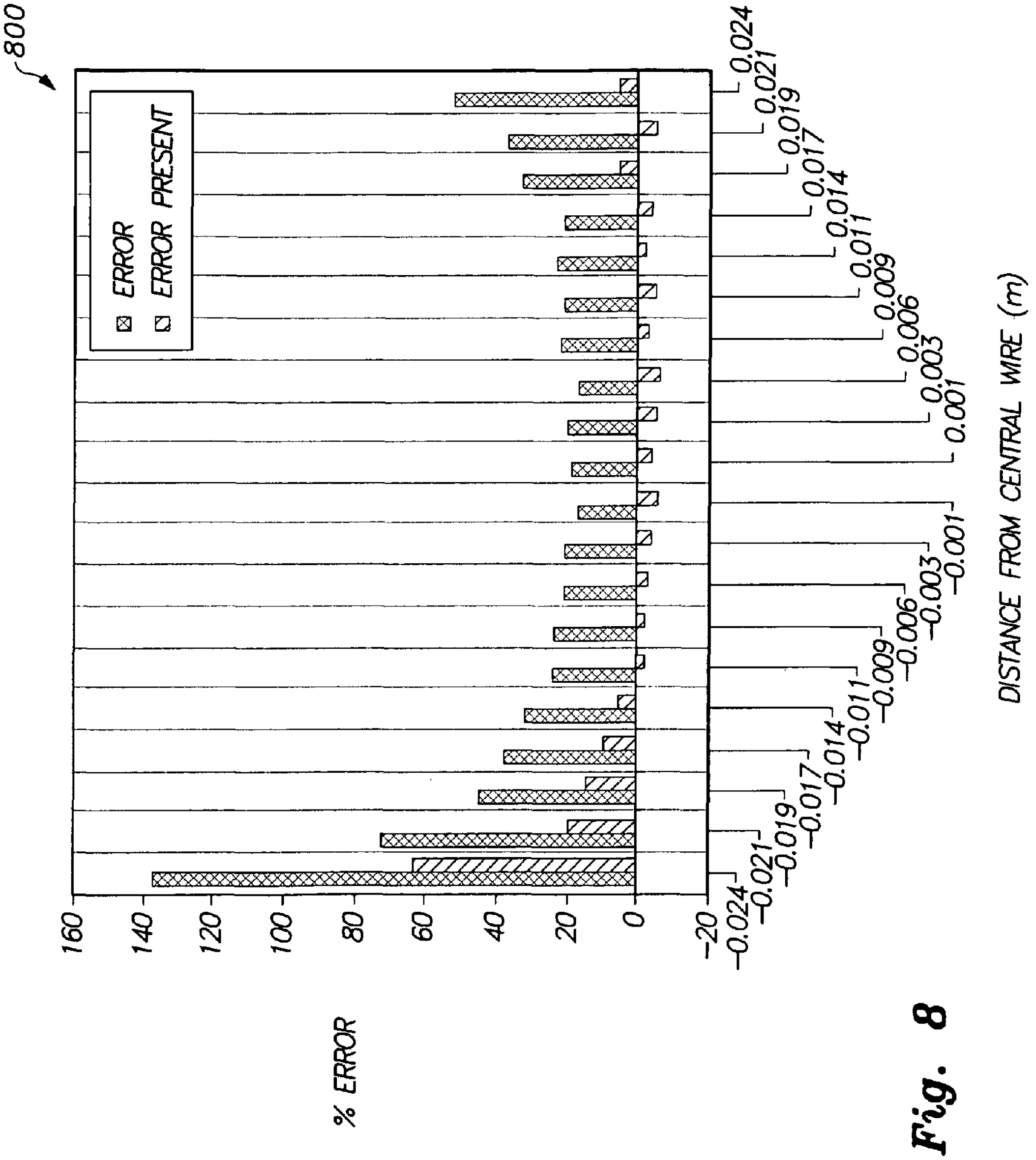
FIG. 8 is a graph comparing algorithm error percentages.

In plot 800, a comparison between the percentage error of the presently computed values and the values obtained by already known methods when taking the experimental values as a base, is shown in FIG. 8. The percentage error is calculated as:

$$\% \text{ Error} = \frac{I_c - I_e}{I_e} \times 100 \tag{18}$$

where c and e are the calculated and experimental values, respectively. The results show clearly that the present method outperforms already known methods.

Using the fabricated experimental setup, the present computational algorithm values are compared to the measured corona power loss and current density profiles. The basic geometrical and operating parameters used are listed in table 900 of FIG. 9A.

Figure 9B:
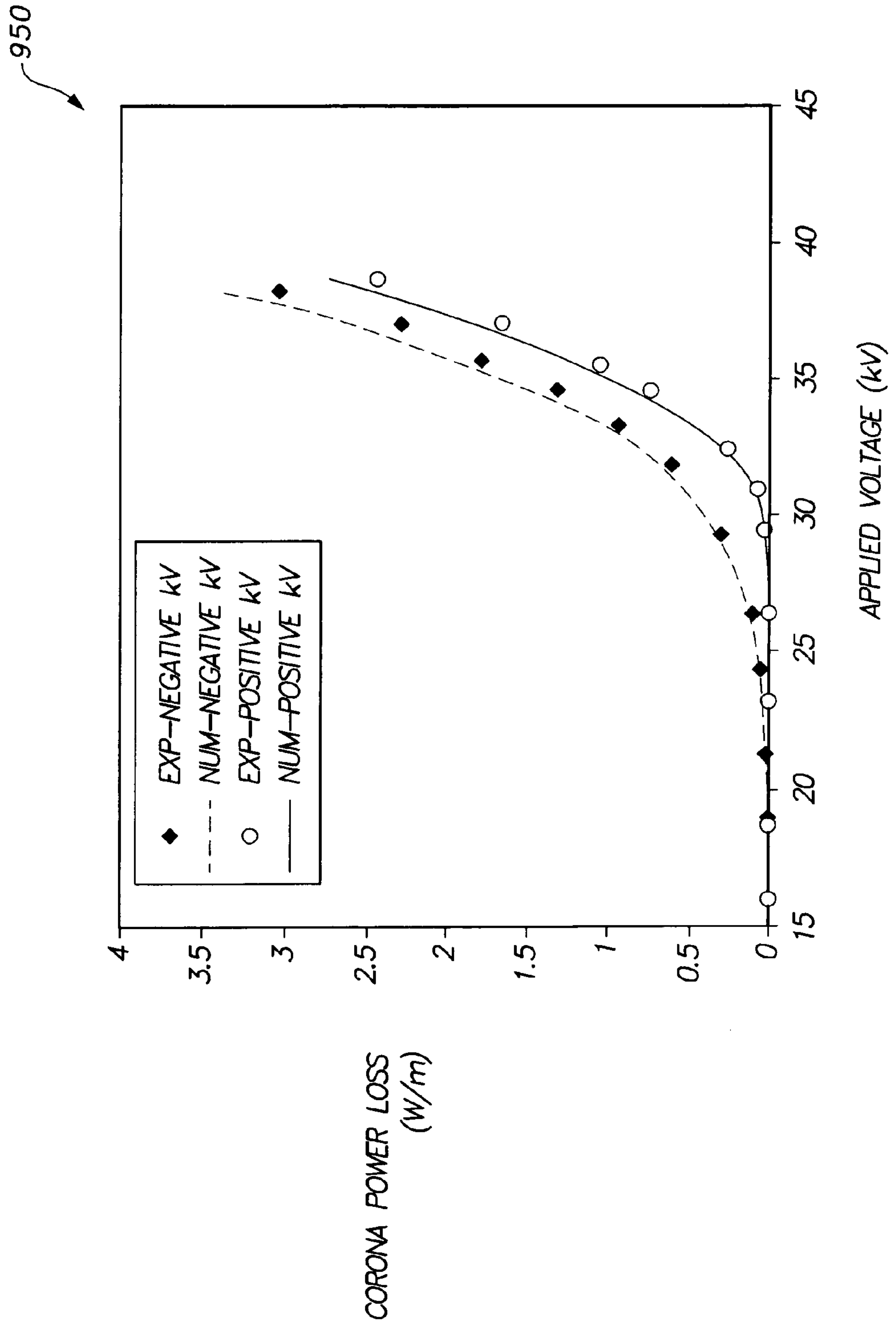
FIG. 9B is a plot showing the effect of varying applied voltage polarity on corona power loss.

The effect of varying the polarity of the applied voltage on the measured and numerically calculated corona power loss characteristics is shown in plot 950 of FIG. 9B. The agreement between the computed and experimental values is satisfactory. As can be seen, for a certain applied voltage, the corona power loss, and hence the value of corona current, is higher for negative applied voltage as compared to the values when the same amount of positive voltage is applied. Therefore, negative applied voltage is used for all present experimental and numerical investigations.

In order to investigate the effect of varying the discharging wire radius, wires with three different radii, namely 0.35 mm, 0.5 mm and 0.85 mm, were used. The presently measured and calculated corona power loss characteristics for the three cases are shown in plot 1000 of FIG. 10. The agreement between the calculated and measured findings is acceptable. Also, it can be seen that as the wire radius increases, the corona power loss decreases. This can be easily attributed to the fact that as the wire radius increases, the corona onset voltage increases, and subsequently the corona current decreases for the same applied voltage.

Figure 11:
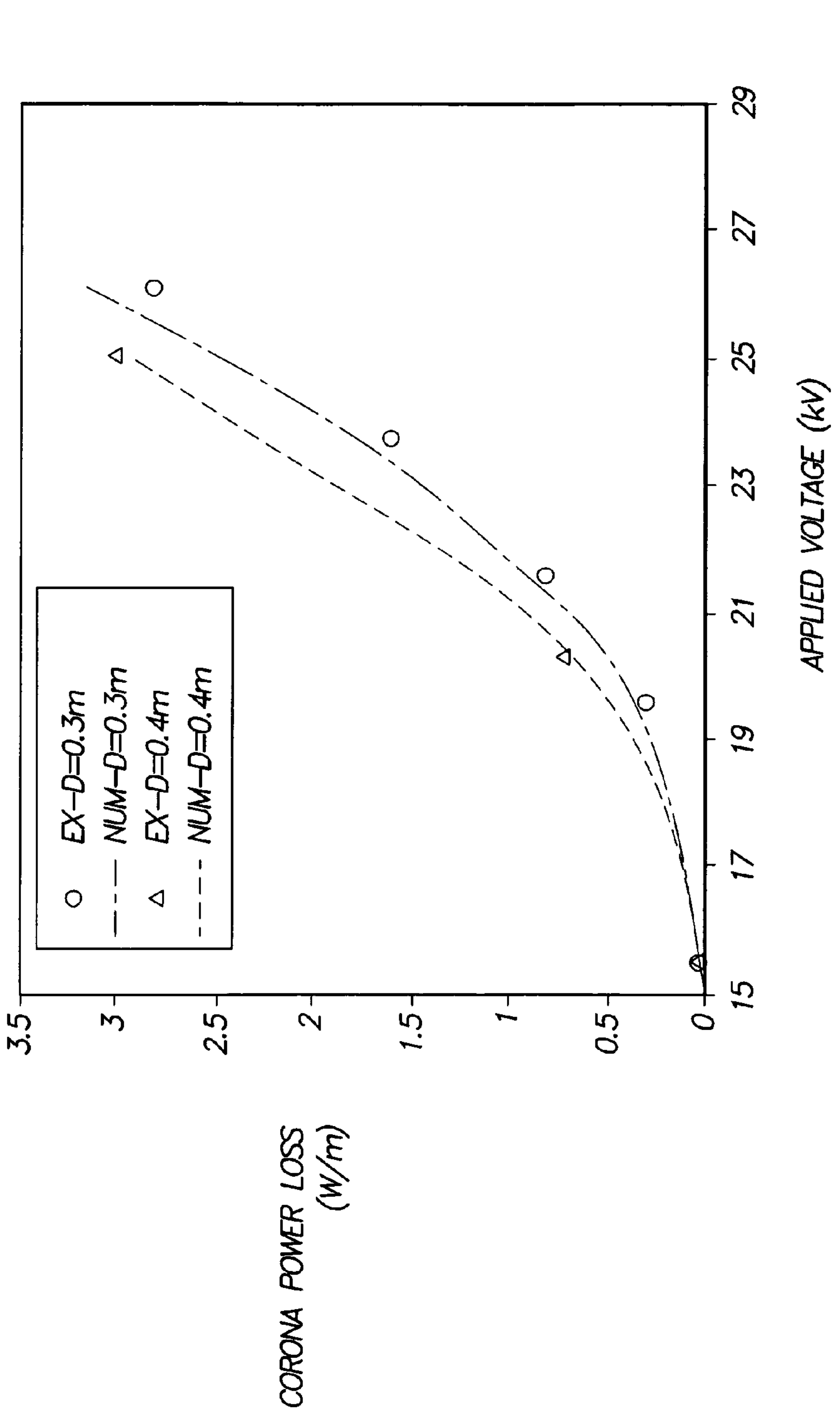
FIG. 11 is a plot showing the effect of varying discharging wire-to-wire spacing on corona power loss.

The effect of varying the discharging wire-to-wire spacing D, while keeping the discharging wire radius and wire-to-plate spacing fixed is investigated. The presently measured and calculated corona power loss characteristics for wire-to-wire spacing of 0.3 m and 0.4 m are in good agreement, and are shown in plot 1100 of FIG. 11.

For a constant discharging wire radius and constant wire-to-plate spacing, the corona power loss increases as the wire-to-wire spacing increases while keeping the voltage constant. This is attributed to the mutual effect among the discharge wires, where each wire, except the wires at the ends, is shielded by the surrounding two wires. Such shielding results in compacting the field lines over the wire surface. The larger the distance between wires, the less compact the field lines and the larger is the area on the wire surface where the field lines emanate. Therefore, the corona current per wire, and hence the total corona current, increases with the increase of the wire-to-wire spacing.

Figure 12:
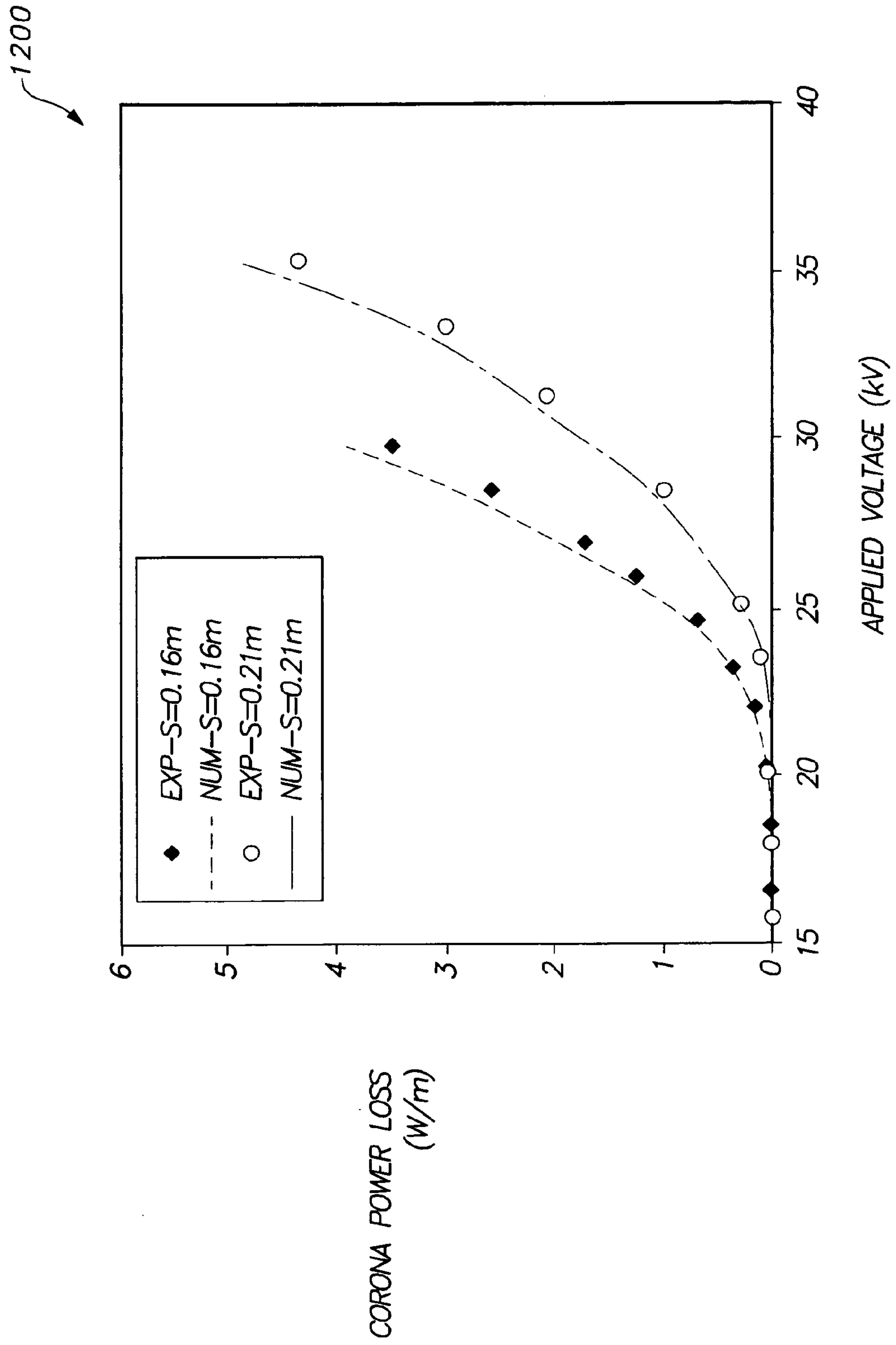
FIG. 12 is a plot showing the effect of varying discharging wire-to-plate spacing on corona power loss.

The effect of varying the discharging wire-to-plate spacing S while keeping the discharging wire radius and wire-to-wire spacing fixed is investigated. The presently measured and calculated corona power loss characteristics for wire-to-plate spacing of 0.16 m and 0.21 m are in good agreement, and are shown in plot 1200 of FIG. 12. It can be seen that, at the same applied voltage, the corona power loss increases as the wire-to-plate spacing decreases. This is attributed to the fact that as the wire-to-plate spacing decreases, the corona onset voltage decreases.

Figure 10:
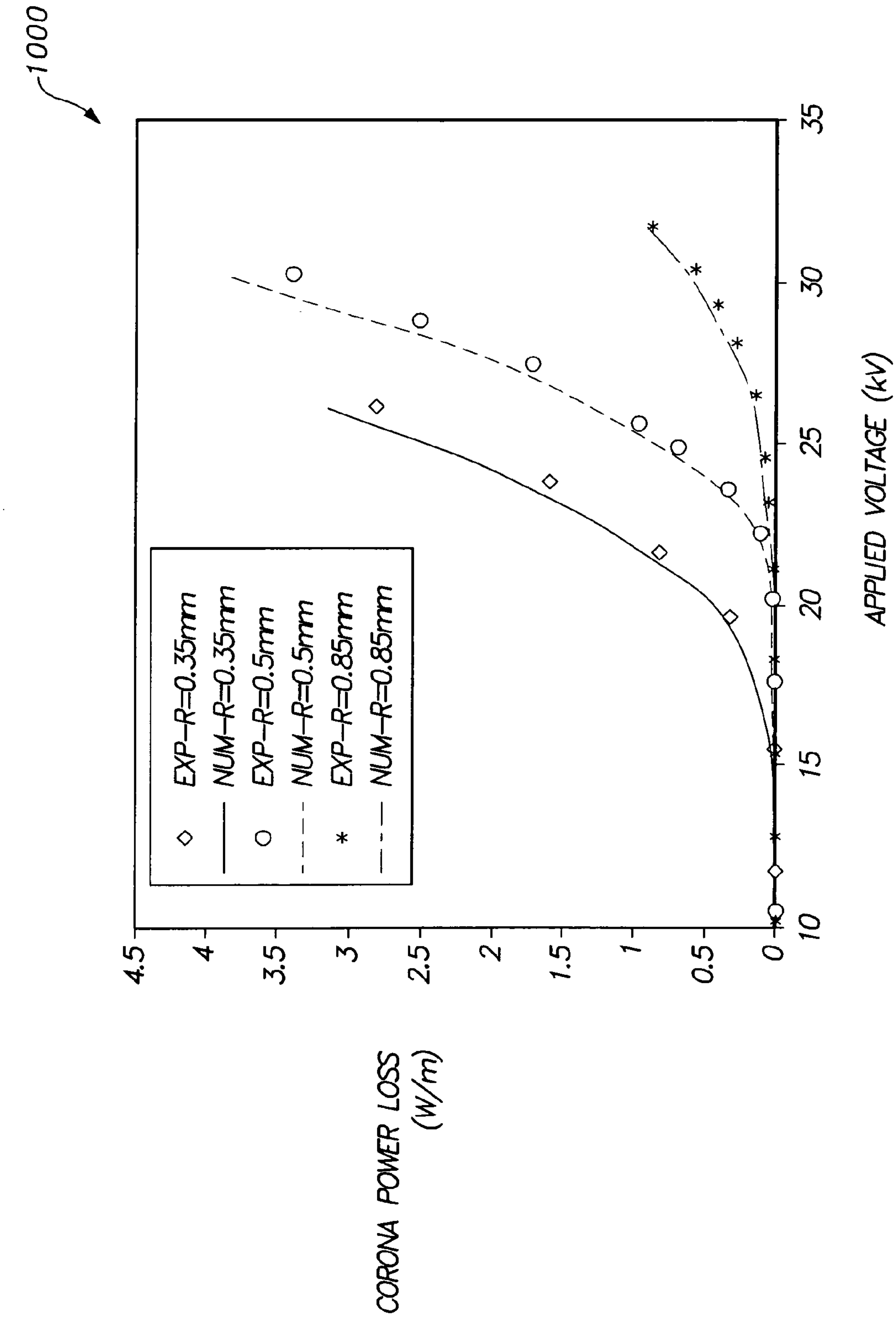
FIG. 10 is a plot showing the effect of varying discharging wire radius on corona power loss.
Figure 13:
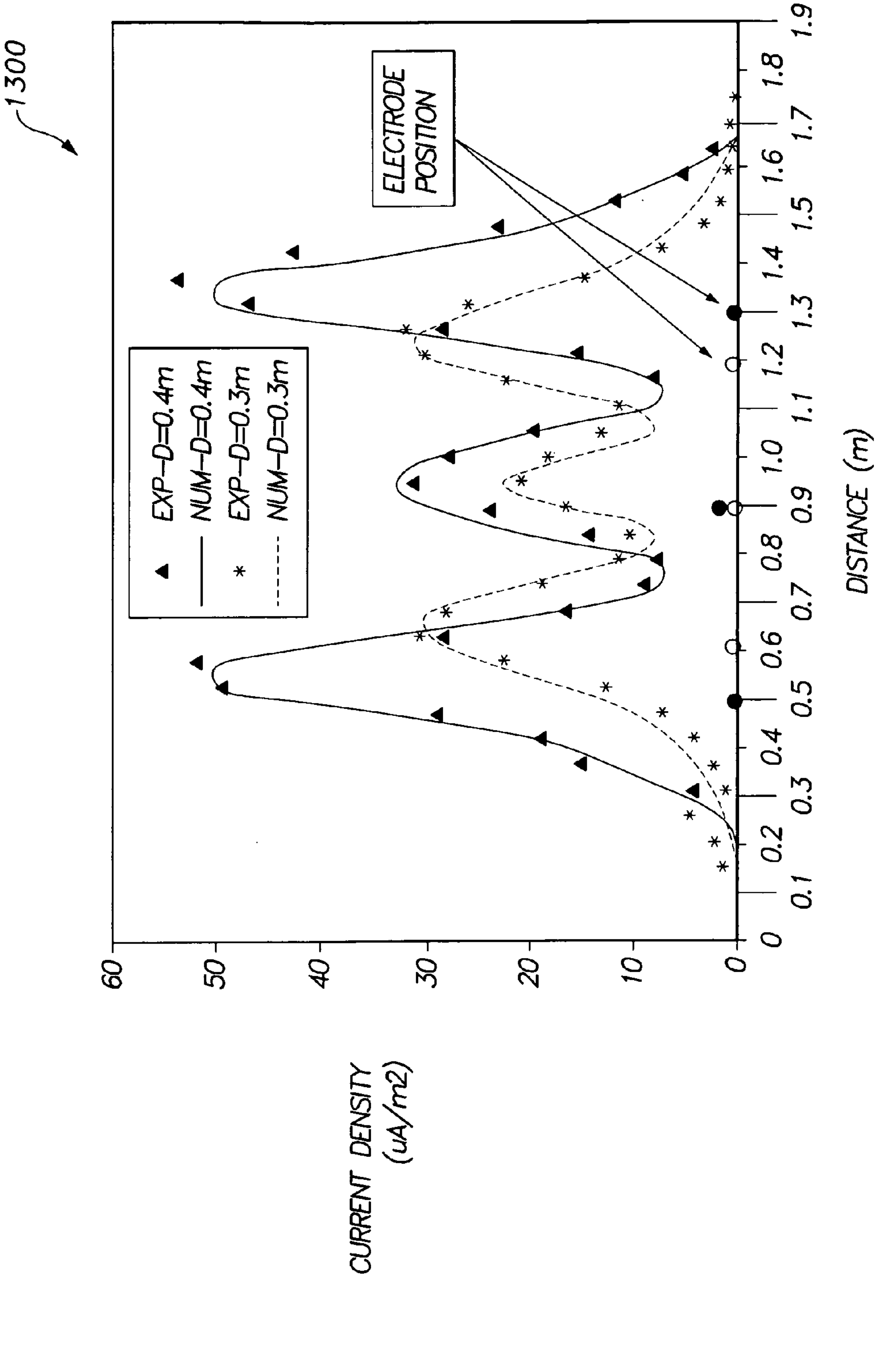
FIG. 13 is a plot showing present calculated and measured ground plate current density distribution.

Ground plate current density profiles are investigated for one of the configurations tested in FIG. 10, namely, for a WDEP with wire-to-plate spacing S of 0.16 m, discharging wire radius R of 0.85 mm, and an applied voltage of −31.5 kV. The presently measured and numerically calculated ground plate current density profiles for two wire-to wire spacings (D=0.3 m and 0.4 m) are shown in plot 1300 of FIG. 13. The results show good agreement between the measured values and the values computed using the present method. It should also be noted that as the wire-to wire spacing increases, the maximum values of the current density profiles increase. This is a consequence of the reduction in the corona onset voltage. Moreover, the maximum current density value under the central discharging wire is less than the other two wires. This is attributed to the mutual effect among the discharge wires, where each wire (except the wires at the ends) is shielded by the surrounding two wires.

It is quite clear from FIGS. 6-8 that the calculated values predicted by the present algorithm are in better agreement with experimental results than previous known attempts. Moreover, the FE grid is generated in a simple way where the characteristic lines follow the FE grid pattern. This will, in effect, reduce the number of FE grid regenerations needed to achieve convergence. The present algorithmic method requires only one loop to guarantee the convergence of the potential, and one loop to update the FE grid. Hence only two loops are needed to guarantee convergence. For example, for one of the configurations, the present algorithm requires 2 grid generations and 5 iterations (a total of 10 iterations) to converge with an accuracy of 0.1% in the computed results. The relatively low number of iterations is attributed to the fact that the FE grid is generated from the intersection of field lines and equipotential contours.

A combined finite element based method (FEM) and a modified method of characteristics (MMC) is developed for the analysis and computation of space charge density, corona current, and power loss associated with WDEP. The present method assures that the characteristic lines follow the FE grid pattern.

It will be understood that the diagrams in the Figures depicting the system and method for estimating corona power loss in a dust-loaded electrostatic precipitator are exemplary only, and may be embodied in a dedicated electronic device having a microprocessor, microcontroller, digital signal processor, application specific integrated circuit, field programmable gate array, any combination of the aforementioned devices, or any other device that combines the functionality of the method for estimating corona power loss in a dust-loaded electrostatic precipitator onto a single chip or multiple chips programmed to carry out the method steps described herein, or may be embodied in a general purpose computer having appropriate peripherals attached thereto and software stored on a computer readable media that can be loaded into main memory and executed by a processing unit to carry out the functionality of the apparatus and steps of the method described herein. Moreover, a user interface is contemplated for conveying to the user the results of the corona current, current density, efficiency computations, and all other computations described herein.

It is to be understood that the present invention is not limited to the embodiment described above, but encompasses any and all embodiments within the scope of the following claims.

We claim:

1. A computer-implemented method for estimating corona power loss in a dust-loaded electrostatic precipitator, comprising the steps of:

computing a total current density vector, calculation of the total current density vector including an ion charge density component for ions and a particle charge density component for particles;

numerically solving Poisson's equation and current continuity equations in which a finite element method (FEM) and a modified method of characteristics (MMC) are used, the numerical solution including the total current density vector calculation over a plurality of finite element nodes;

defining characteristic lines following a Finite Element grid pattern, thereby resulting in fast convergence and reduced computational time;

computing corona current and current density based on the steps of numerically solving the describing equations;

generating an FE boundary fitted grid matched to geometry of the dust-loaded electrostatic precipitator, wherein the grid is generated from intersection of field lines, the field lines emanating from M nodes selected on a circumference of a discharging conductor of the electrostatic precipitator, and N equipotential counters;

calculating a particle charge density $\rho_p$ at each of the nodes as $\rho_p=\epsilon_0 f S_p E$, wherein $\epsilon_0$ represents the permittivity of free space, f is a variable equal to 3 for conducting particles and equal to $$\frac{3\varepsilon}{\varepsilon+2}$$

for particles having a relative permittivity of $\epsilon$, $S_p$ represents the particle's specific surface, and E represents the electric field at the node, wherein the particle's specific surface $S_p$ is calculated as $S_p=4\Pi a^2 N_p$, where a is a radius of the particle and $N_p$ represents particle concentration; and calculating particle mobility $k_p$ as $k_p=\rho_p/6\Pi N_p \gamma a$, where $\gamma$ is a viscosity of air.

2. The computer-implemented method for estimating corona power loss according to claim 1, further comprising the step of representing a concentration of the particles as a constant over a given cross section of the electrostatic precipitator.

3. The computer-implemented method for estimating corona power loss according to claim 1, further comprising the steps of:

making the grid fine in regions of high field gradient; and making the grid coarse in regions of low field gradients.

4. The computer-implemented method for estimating corona power loss according to claim 1, further comprising the step of: determining electric field values at the FE nodes from a third order interpolating polynomial of the potentials.

5. The computer-implemented method for estimating corona power loss according to claim 1, further comprising the step of: generating triangular finite elements from intersection of the field lines with contours of the equipotentials.

6. The computer-implemented method for estimating corona power loss according to claim 1, further comprising the steps of:

providing a first estimate of ionic space charge density values at the finite element nodes;

transforming a partial differential equation governing evolution of charge density to an ordinary differential equation defined along specific flux tube trajectories of the finite element grid, the specific flux tube trajectories emanating from a surface of the discharging wire and terminating at grounded plates of the electrostatic precipitator;

calculating a potential within each finite element of the finite element grid;

determining whether a result of the step of calculating a potential is self consistent; and correcting error in the particle and space charge density calculations.

7. A single stage, dry-type, parallel plate electrostatic precipitator for measuring corona current and power loss, comprising:

a high voltage source;

a dust particle feeder and blower;

a variable AC transformer controlling speed of the blower;

a first plate covered by a plurality of aluminum strips separated by a predetermined spacing, a hole being defined in each of the aluminum strips;

electroconductive nails disposed in the aluminum strip holes;

a current measuring board;

wires connected to and leading from the electroconductive nails, the wires being connected to and terminating at the current measuring board;

an unbroken aluminum sheet-covered second plate, the first and second plates defining a chamber;

a funnel connected to the dust particle feeder through which the particles are dispersed into the chamber defined by the first and second plates, the first and second plates being physically parallel to each other; and sphere-tipped movable conductors disposed in the chamber between the parallel plates, the movable conductors enabling wire-to-wire spacing to be changed in gathering empirical corona discharge power loss measurements when the high voltage source is connected to the parallel plates.

* * * * *